(12) United States Patent
Lindner et al.

(10) Patent No.: US 12,066,304 B2
(45) Date of Patent: Aug. 20, 2024

(54) SWITCHING ASSEMBLY AND METHOD FOR MEASURING A POSITION OF A CONTACT BRIDGE IN A SWITCHING ASSEMBLY

(71) Applicant: TE Connectivity Germany GmbH, Bensheim (DE)

(72) Inventors: Christian Lindner, Bensheim (DE); Bernd Rahn, Bensheim (DE); Peter Sandeck, Bensheim (DE); Matthias Kroeker, Bensheim (DE); Harry Koch, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 90 days.

(21) Appl. No.: 17/482,732

(22) Filed: Sep. 23, 2021

(65) Prior Publication Data

US 2022/0090941 A1    Mar. 24, 2022

(30) Foreign Application Priority Data

Sep. 23, 2020 (DE) .......................... 102020124802.4

(51) Int. Cl.
*G01D 5/14* (2006.01)
*H01H 71/04* (2006.01)
*H03K 17/97* (2006.01)

(52) U.S. Cl.
CPC ............ *G01D 5/145* (2013.01); *H01H 71/04* (2013.01); *H03K 17/97* (2013.01); *H01H 2071/048* (2013.01); *H01H 2205/016* (2013.01)

(58) Field of Classification Search
CPC ............ G01D 5/12; G01D 5/14; G01D 5/142; G01D 5/145; H01H 1/0015; H01H 71/04; H03K 17/965; H03K 17/97
See application file for complete search history.

(56) References Cited

U.S. PATENT DOCUMENTS 6,066,999 A    5/2000   Pischinger
9,852,865 B2 * 12/2017  Kroeker ................. H01H 50/22
(Continued)

FOREIGN PATENT DOCUMENTS

CN    105244204 A1    1/2016
DE     10260249 A1    8/2004
(Continued)

OTHER PUBLICATIONS

Abstract of DE 10260249, dated Aug. 12, 2004, 2 pages.
(Continued)

*Primary Examiner* — Huy Q Phan
*Assistant Examiner* — David B Frederiksen
(74) *Attorney, Agent, or Firm* — Barley Snyder (57) ABSTRACT

A switching assembly comprises a pair of fixed contacts, and a contact bridge movable between a bridging position in which the contact bridge electrically connects the contacts and a separated position in which the contacts are electrically separated. A detector of the assembly includes at least one sensor for detecting the presence of the contact bridge in at least one of the separated position or the bridging position, and a controller operatively connected to the sensor and having a first switching point and a second switching point. One of the switching points is associated with a position of the contact bridge between the bridging position and the separated position.

20 Claims, 10 Drawing Sheets

(56) References Cited

U.S. PATENT DOCUMENTS

| | | | |
|---|---|---|---|
| 10,115,512 | B2 | 10/2018 | Koch et al. |
| 10,854,406 | B2 * | 12/2020 | Bobert ............... H01H 36/0013 |
| 2004/0130217 | A1 | 7/2004 | Moldovan et al. |
| 2006/0055498 | A1 * | 3/2006 | Darr ........................ H01H 9/10 337/143 |
| 2008/0036561 | A1 | 2/2008 | Hartinger et al. |
| 2008/0192402 | A1 | 8/2008 | Mitlmeier et al. |
| 2010/0060287 | A1 | 3/2010 | Keil et al. |
| 2013/0335174 | A1 * | 12/2013 | Kodama ............. H01H 47/002 335/2 |
| 2014/0263186 | A1 | 9/2014 | Gerving et al. |
| 2015/0061471 | A1 * | 3/2015 | Kopecek ................ G01D 5/145 324/207.13 |
| 2015/0380145 | A1 | 12/2015 | Koch et al. |
| 2016/0181038 | A1 | 6/2016 | Shimizu et al. |
| 2018/0166244 | A1 * | 6/2018 | Kobayashi ............ H01H 50/54 |
| 2018/0308650 | A1 * | 10/2018 | Koch ................... H01H 50/641 |
| 2019/0018065 | A1 * | 1/2019 | Lapiere ............. H01H 11/0062 |
| 2020/0227220 | A1 | 7/2020 | Oehler et al. |
| 2020/0365338 | A1 | 11/2020 | Rushabh et al. |
| 2021/0027964 | A1 * | 1/2021 | Yamakawa ............ H01H 47/02 |
| 2021/0151269 | A1 * | 5/2021 | Hoffmann ............. H01H 33/22 |
| 2021/0249210 | A1 | 8/2021 | Grunack |

FOREIGN PATENT DOCUMENTS

| | | | |
|---|---|---|---|
| DE | 102014212132 | A1 | 12/2015 |
| DE | 102015224658 | A1 | 6/2017 |
| EP | 2960923 | A1 | 6/2015 |
| EP | 3252879 | A1 | 12/2017 |
| JP | 201627560 | A | 2/2016 |
| JP | 2019503056 | A | 1/2019 |
| WO | 0141174 | A1 | 6/2001 |
| WO | 2006133659 | A1 | 12/2006 |
| WO | 2008023365 | A1 | 2/2008 |
| WO | 2012059418 | A1 | 5/2012 |
| WO | 2019141529 | A1 | 7/2019 |
| WO | WO-2019141529 | A1 * | 7/2019 ......... G01R 31/3274 |
| WO | 2020016179 | A1 | 1/2020 |
| WO | WO-2020043515 | A1 * | 3/2020 ............... H01H 1/20 |

OTHER PUBLICATIONS

Indian Examination Report dated Mar. 29, 2022, corres. to Application No. 202144042648, 6 pp.

Extended European Search Report, Application No. 21197788.9-1202, Dated: Feb. 8, 2022, 8 pages.

Japanese Office Action dated Oct. 25, 2022, corresponding to Application No. 2021-150733, with English translation, 9 pages.

French Search Report dated Jul. 26, 2023, corresponding to Application No. FR2209187, 8 pages.

Indian Examination Report dated Jul. 27, 2023, corresponding to Application No. 202244051928, 6 pages.

Office Action from the Intellectual Property Office of Korea dated Apr. 26, 2023 with English translation thereof, corresponding to Application No. 10-2021-0123903, 15 pages.

Chinese First Office Action dated Aug. 22, 2023 with English translation, corresponding to Application No. 202111085485.5, 18 pages.

European Patent Office Examination Report dated Feb. 21, 2024, corresponding to Application No. 21 197 788.9-1201, 5 pages.

\* cited by examiner

SWITCHING ASSEMBLY AND METHOD FOR MEASURING A POSITION OF A CONTACT BRIDGE IN A SWITCHING ASSEMBLY

CROSS-REFERENCE TO RELATED APPLICATIONS

This application claims the priority benefit of German Patent Application No. DE 10 2020 124 802.4 filed on Sep. 23, 2020, the disclosure of which is incorporated herein by reference for all purposes.

FIELD OF THE INVENTION

The present invention relates to electrical switches, and more particularly, to a switching assembly including a contact position detector.

BACKGROUND

Switching assemblies are often used to control electrical supplies in high-voltage and/or high-current ranges. Known embodiments have two contacts, and a contact bridge which is movable from a bridging position, in which the contact bridge electrically connects the contacts to one another, to a separated position, in which the contacts are electrically isolated. Switching assemblies may include a detector with at least one detector element by means of which the presence of the contact bridge at the separated position and/or the bridging position is detectable. Often, however, a fault state in which, for example, one of the contacts is welded to the contact bridge is not detected or is incorrectly declared as open or closed. This makes such switching assemblies unreliable. In other known switching assemblies, the switching state is determined by applying a voltage in the circuit and determining the contact state by measuring the voltage drop across the contacts. For this purpose, if there is more than one switching element in the circuit, it will be necessary to close the switching element that is not to be examined. This process is time consuming and inefficient.

Accordingly, improved solutions for determining the switching state of an electrical switching assembly are desired.

SUMMARY

According to an embodiment of the present disclosure a switching assembly comprises a pair of fixed contacts, and a contact bridge movable between a bridging position in which the contact bridge electrically connects the contacts to one another and a separated position in which the contacts are electrically separated from one another. A detector of the assembly includes at least one sensor for detecting the presence of the contact bridge in at least one of the separated position or the bridging position, and a controller operatively connected to the sensor and having a first switching point and a second switching point. One of the switching points is associated with a position of the contact bridge between the bridging position and the separated position.

BRIEF DESCRIPTION OF THE DRAWINGS

The invention will now be described by way of example with reference to the accompanying Figures, of which.

DETAILED DESCRIPTION OF THE EMBODIMENTS

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 3:
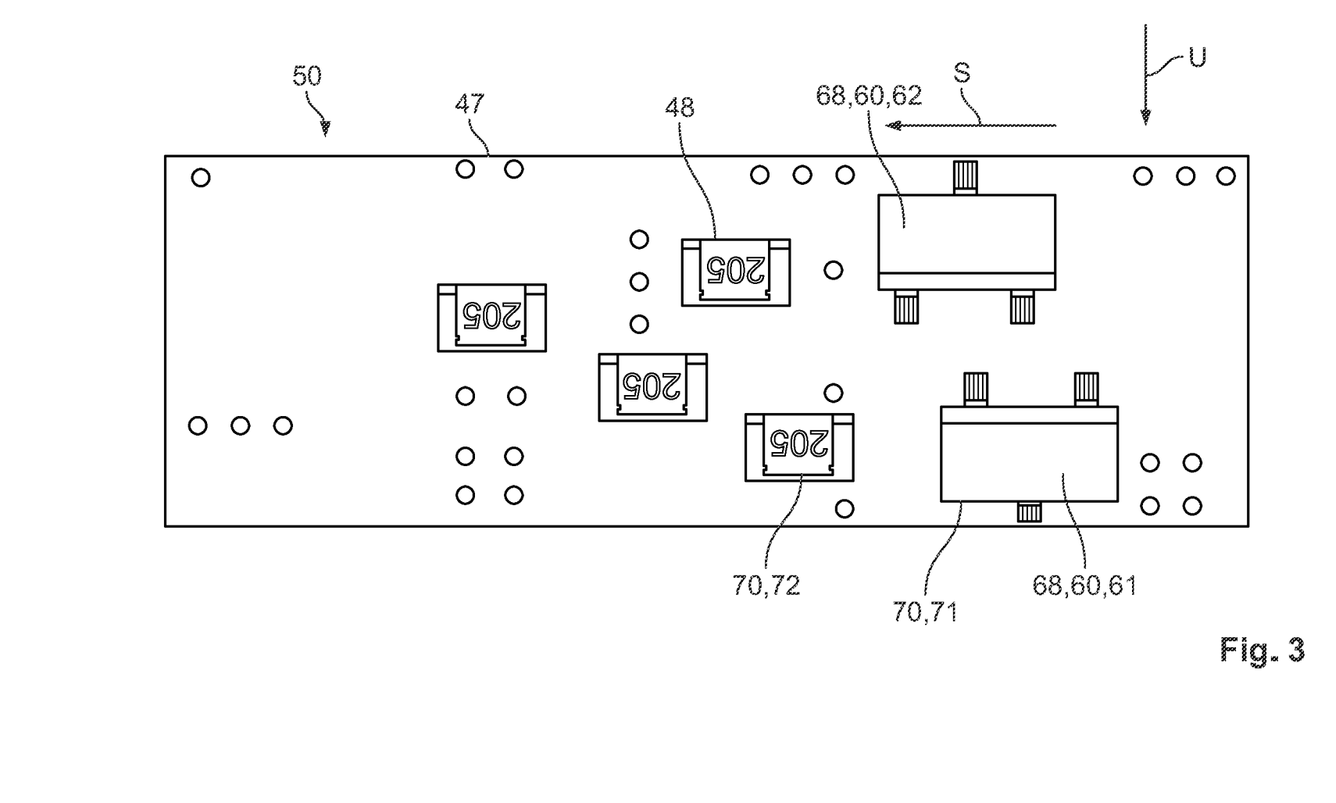
FIG. 3 a schematic view of a detector.
Figure 4:
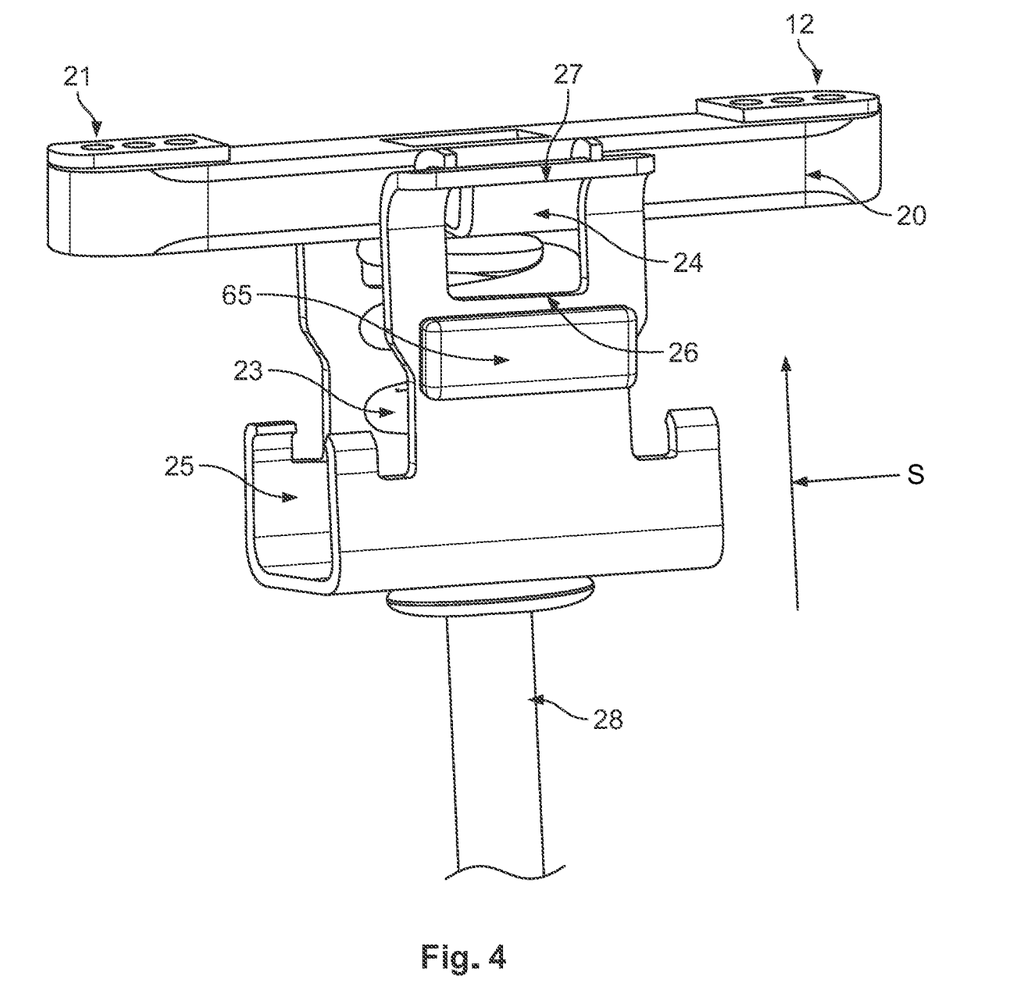
FIG. 4 a schematic perspective view of a contact bridge carrier with an indicator element.
Figure 5:
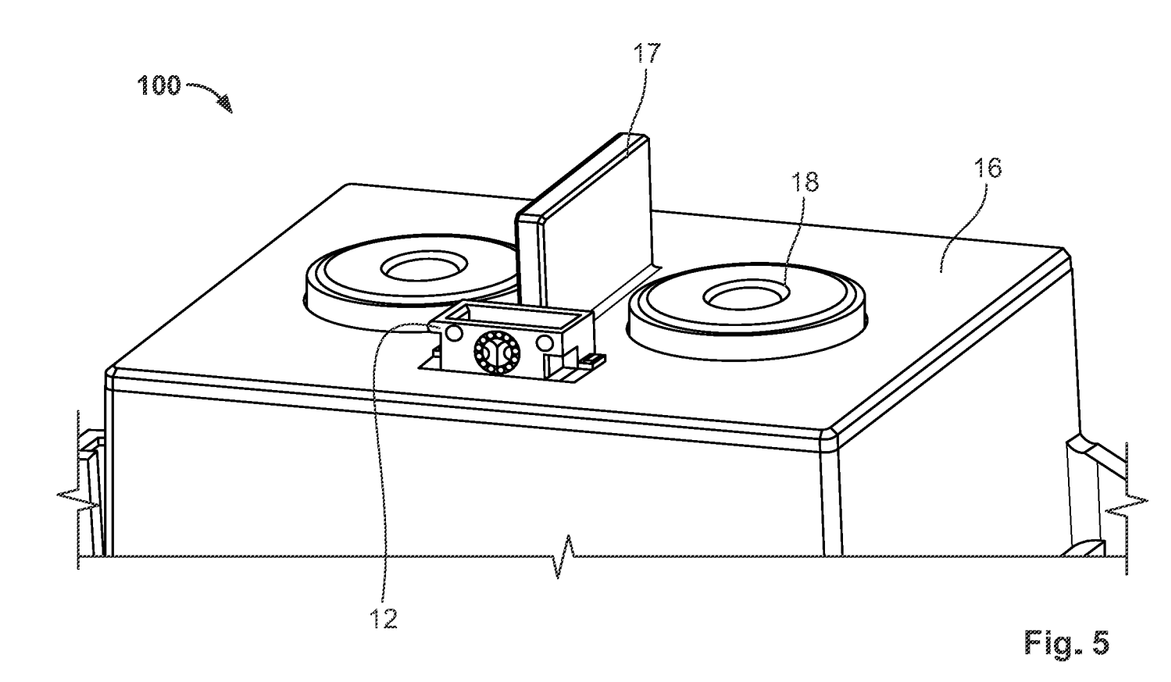
FIG. 5 a schematic perspective view of a switching assembly.

FIGS. 1-6 show a first embodiment of a switching assembly 100. With particular reference to FIG. 5, the switching assembly 100 comprises a housing 16. Two terminal elements 18 are accessible from outside for connecting a circuit to be switched. The two terminal elements 18 have provided between them a partition 17 for electrical insulation. In addition, a connector 12 of a switch state detector 50 projects from the housing 16.

Figure 1:
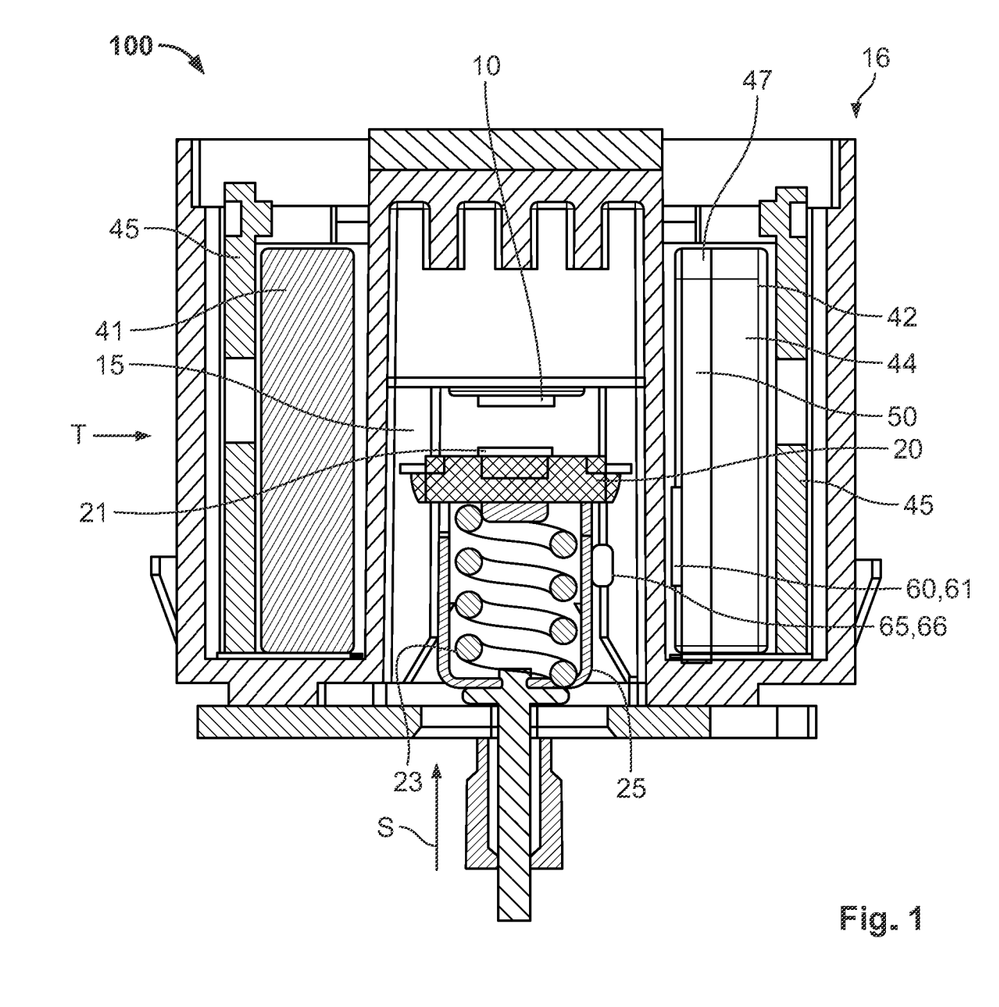
FIG. 1 a schematic sectional view through a switching assembly from the side.
Figure 2:
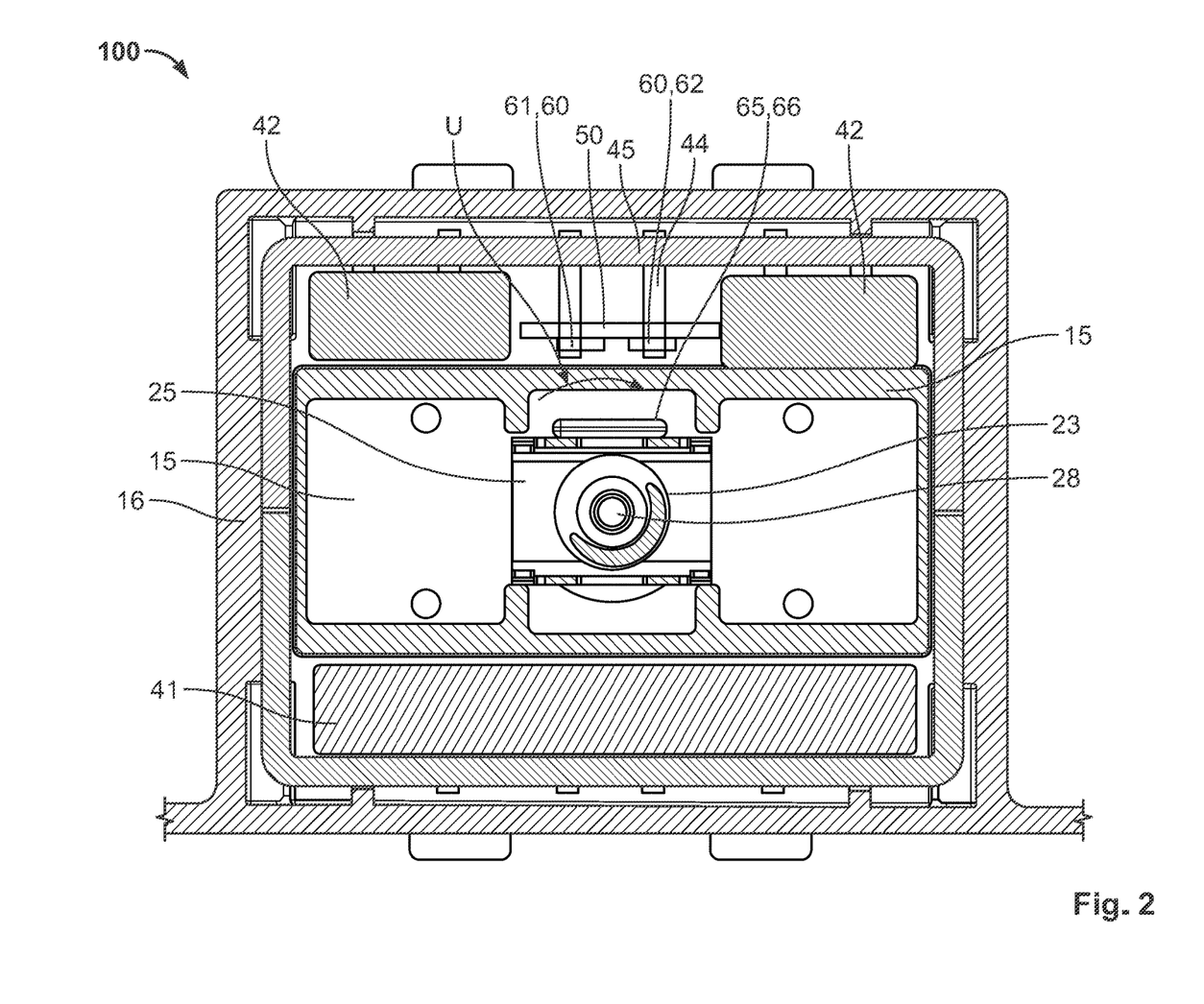
FIG. 2 a schematic sectional view through a switching assembly from above.

At least two contacts 10 are provided inside the housing 16 and are each connected to a respective terminal element 18 in an electrically conductive manner. In order to connect the two contacts 10 to each other, a movable contact bridge 20 is provided. The contact bridge 20 consists of an electrically conductive material and is adapted to be selectively connected to the contacts 10 at two contact points 21, so as to close the circuit.

The contact bridge 20 is movably mounted on and at least partially supported in a contact bridge carrier 25. A projection 24 on the contact bridge 20 is movable along a switching direction S within a motion link 26 of the contact bridge carrier 25. The contact bridge carrier 25 has formed thereon a stop 27 on one end, which limits the movement of the projection 24 and thus of the contact bridge 20 along the switching direction S.

The contact bridge 20 is preloaded relative to the contact bridge carrier 25 by a spring 23 acting along the switching direction S. At the separated position T shown in FIG. 1, the contact bridge 20 is preloaded towards the contact elements 10. The contact bridge carrier 25 is fixedly mechanically connected to a drive rod 28, which may be driven by, for example, a magnetic coil. During a movement along a switching direction S, the contact bridge 20 reaches a bridging position B, at which the contact bridge 20 conductively connects the contacts 10. After contact has been established, the spring 23 is compressed and generates a contact force between the movable contact points 21 and the fixed contacts 10, so as to ensure reliable electrical contact. During this process, the contact bridge 20 moves relative to the contact bridge carrier 25 and within the motion link 26.

In order to determine the position of the contact bridge 20, the switching assembly 100 comprises a detector 50. The detector 50 has two detector elements 60 which detect a magnetic field 96 emitted by an indicator element 65. The detector 50 includes a first detector element 60, 61 and a second detector element 60, 62 and is arranged outside a switching chamber 15, so that it will be protected against high voltages and arcs. The indicator element 65, which is configured as a permanent magnet 66, is arranged within the switching chamber 15 and is insensitive to high voltages and arcs that may occur when the contacts 10 are being separated from the contact bridge 20. In other embodiments, the detector 50 may utilize other sensor types (e.g., optical) for determining the position of the contact bridge 20 without departing from the scope of the present disclosure.

The indicator element 65 is fixedly connected to the contact bridge carrier 25. Specifically, the indicator element 65 is attached to the side of the contact bridge carrier 25 by, for example, adhesive bonding, welding or a form-fit. The indicator element 65 may comprise, for example, rare earth material(s), so as to generate high magnetic field strengths.

The first detector element 60, 61 is displaced relative to the second detector element 60, 62 along the switching direction S. The first detector element 60, 61 may be assigned to the separated position T. The second detector element 60, 62 may be assigned to the bridging position B. In addition, the first detector element 60, 61 and the second detector element 60, 62 are displaced along a tangential direction U, so as to allow a small displacement along the switching direction S. In one embodiment, the detector elements 60, 61, 62 are arranged on a printed circuit board 47 on which other components 48 (e.g., memory, processors, etc.) for performing the operations described herein are also provided. The detector elements 60 may be configured as Hall sensors 68 which detect magnetic fields, although any magnetometer or magnetic field sensor may also be implemented.

The detector 50 further comprises two-point controllers 70 (on/off controllers or binary controllers) assigned to the detector elements 60. For example, a first two-point controller 70, 71 may be integrated into the detector element 60, 61. In a further embodiment, a two-point controller 70, 72 may be arranged outside the detector element 60, and be operatively connected thereto.

The two-point controllers 70 are configured to have a first switching point 111, 121 and a second switching point 112, 122 that is different from the first switching point 111, 121. One of the two switching points 111, 112, 121, 122 is assigned to a position of the contact bridge 20 between the bridging position B and the separated position T. This position falls outside a fault area, in which a fault may occur. For example, a contact 10 may weld to a contact point 21 due to excessively high currents. In an attempt to cause the contact bridge 20 to move from the bridging position B to the separated position T, this weld may have the effect that the contact bridge 20 moves only slightly away from the bridging position B (e.g., only a few hundred micrometers). Although the contact bridge 20 has then left the bridging position B, the circuit has not yet been reliably separated. Due to the fact that one of the switching points 111, 112, 121, 122 lies beyond an area in which a faulty contact bridge 20 can move, it is guaranteed that the contact bridge 20 has actually become detached completely when the switching operation takes place. For example, a switching point 111, 112, 121, 122 may be assigned to a position, at which the contact bridge 20 is one millimeter, two millimeters, or five millimeters away from the bridging position B.

Figure 8:
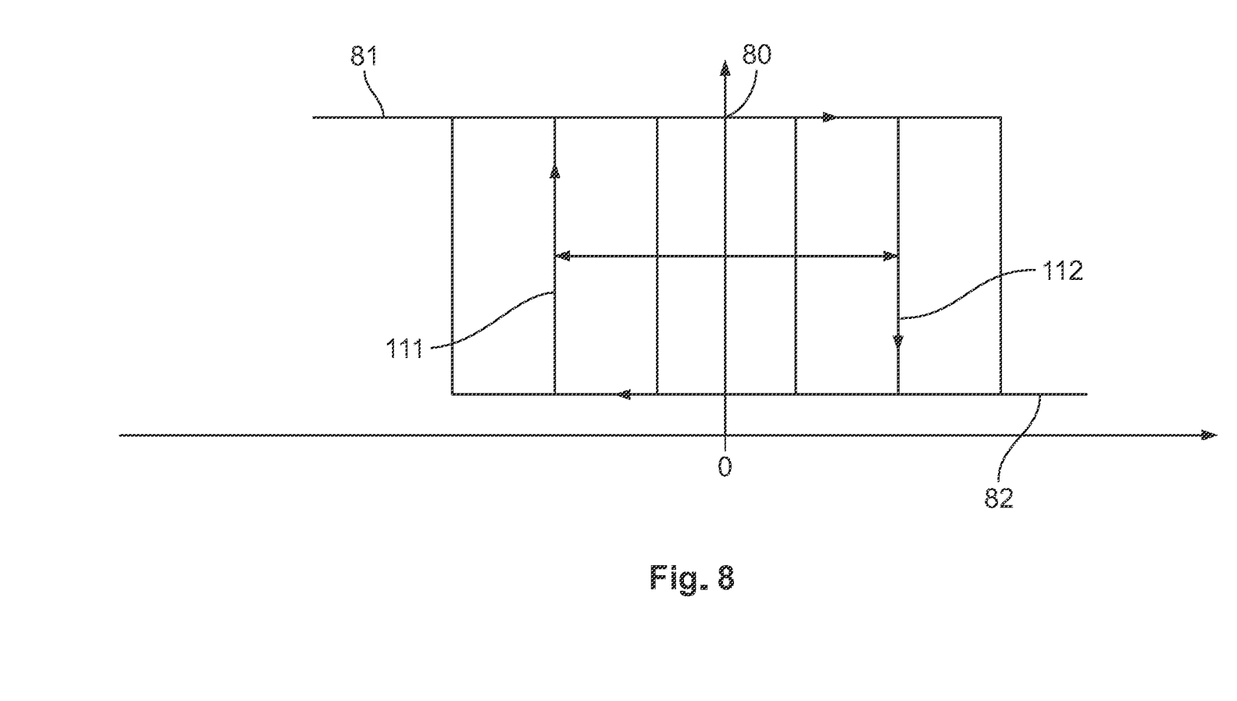
FIG. 8 a schematic view of a switching behaviour of a detector element.

An explanation of the switching behaviour of embodiments of the present disclosure is illustrated in FIG. 8. As shown, a two-point controller 70 of a detector element 60 has a first switching point 111 and a second switching point 112. The measured variable relevant to the switching operation, e.g., a measured magnetic field, is plotted on the abscissa. The output signal 80 of the detector element 60 is shown on the ordinate. The output signal 80 may exhibit a first output signal 81 with a first signal level or a second output signal 82 with a second signal level. The first and second output signals 81, 82 may be digital output signals.

The two-point controller 70 exhibits a hysteresis of lag. If the measured variable is varied, the output signal 80 will be path-dependent. If the signal strength of the measured variable increases, switching from the first output signal 81 to the second output signal 82 will take place at a second switching point 112. If the signal strength of the measured variable is then reduced, switching back to the first output signal 81 will only take place at a first switching point 111. It follows that the first switching point 111 and the second switching point 112 are spaced apart along the measured variable.

Advantageously, the switching process takes place around a zero point of the measured magnetic field. The first switching point 111 is assigned to a magnetic field in a first direction, the second switching point 112 is assigned to a magnetic field in a second direction opposite to the first direction. In this way, the absolute values of the magnetic fields belonging to the switching points 111, 112 are equal. For example, the first switching point 111 may be at +0.2 mT and the second switching point 112 may be at −0.2 mT. Structurally implementing such an embodiment can be particularly efficient, as available detector elements may be used without the need to be programmed to special switching values.

Figure 9:
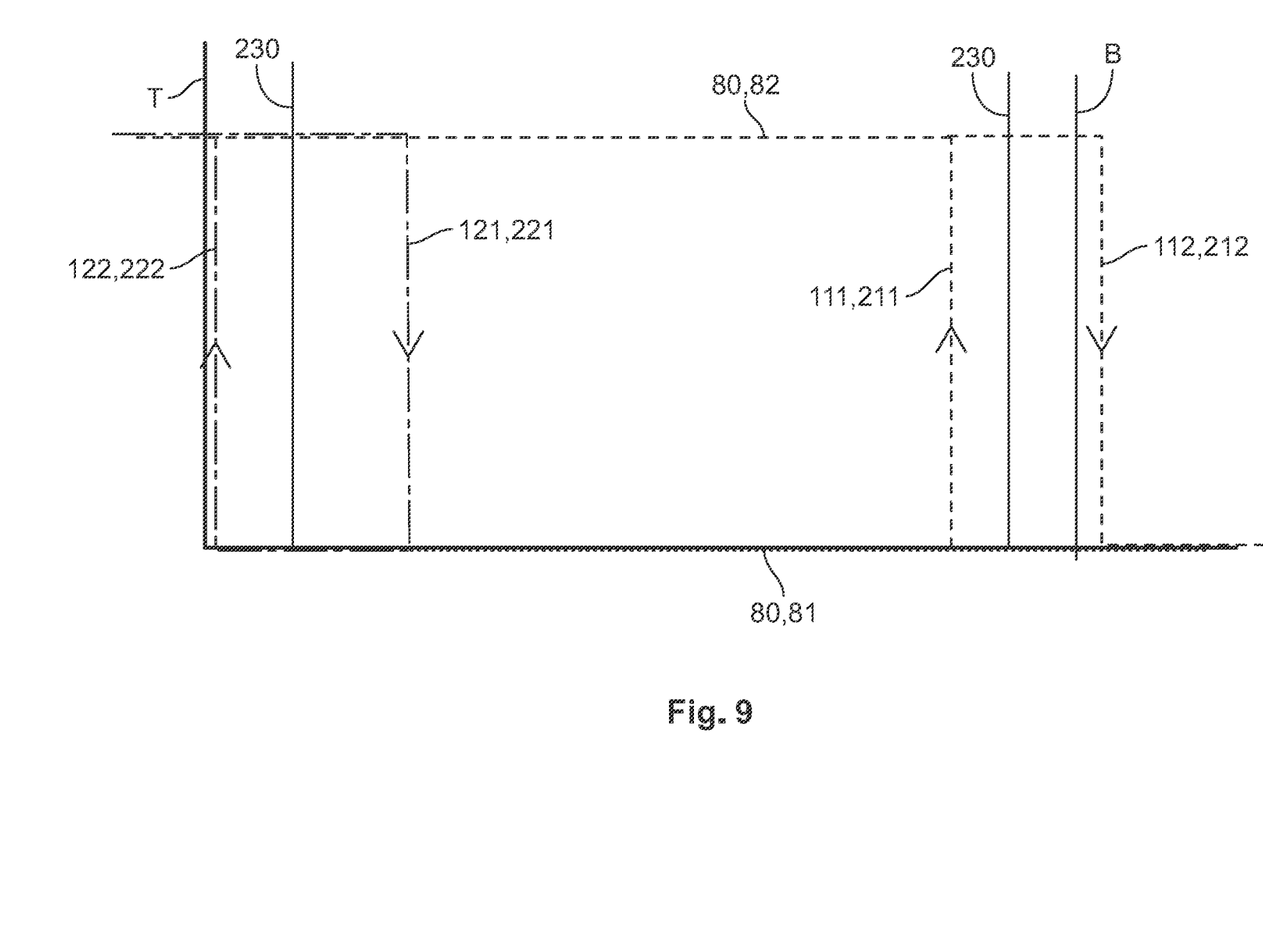
FIG. 9 a schematic view of possible switching behaviours of two detector elements of a switching assembly.

FIG. 9 shows various embodiments for the positions of the switching points 111, 112, 121, 122 and the associated positions 211, 212, 221, 222 of the contact bridge 20. In the embodiment shown, at the separated position T, the second switching point 122 and the associated position 222 are arranged close to the separated position T. The separated position T and the switching point 122 and its associated position 222 may also coincide, so as to allow a reliable detection of the separated position T.

The first switching point 121 and its associated position 221 are located between the separation position P and the bridging position B. Furthermore, the first switching point 121 and its associated position 221 are located between the second switching point 122 and its associated position 222 and the two switching points 111, 112 and their associated positions 211, 212 of the further detector element 60, which is assigned to the bridging position B.

A boundary 230 of the malfunction area is located between the two switching points 121, 122 and between their associated positions 221, 222. This ensures that the detector will switch the detector element 60 only to the respective other output signal 81, 82, when the malfunction area 230 has been swept.

In the case of the detector element 60 assigned to the bridging position B, the switching points 111, 112, 121, 122 are arranged in a slightly different manner. Even though the first switching point 111 and its associated position 211 are again arranged beyond a malfunction area, so that the boundary 230 of the malfunction area is located between the two switching points 111, 112 and between their associated positions 211, 212, the second switching point 112 and its associated position 212 are arranged behind the bridging position B. The bridging position B is thus located between the first switching point 111 and the second switching point 112 and between the respective positions 211, 212 associated with these switching points. It follows that switching to the other output signal 81 will only take place after the contact bridge 20 has reached the bridging position B. This is the result of the contact bridge 20 being spring-mounted in the contact bridge carrier 25 and the indicator element 65 being arranged on the contact bridge carrier 25.

Figure 10:
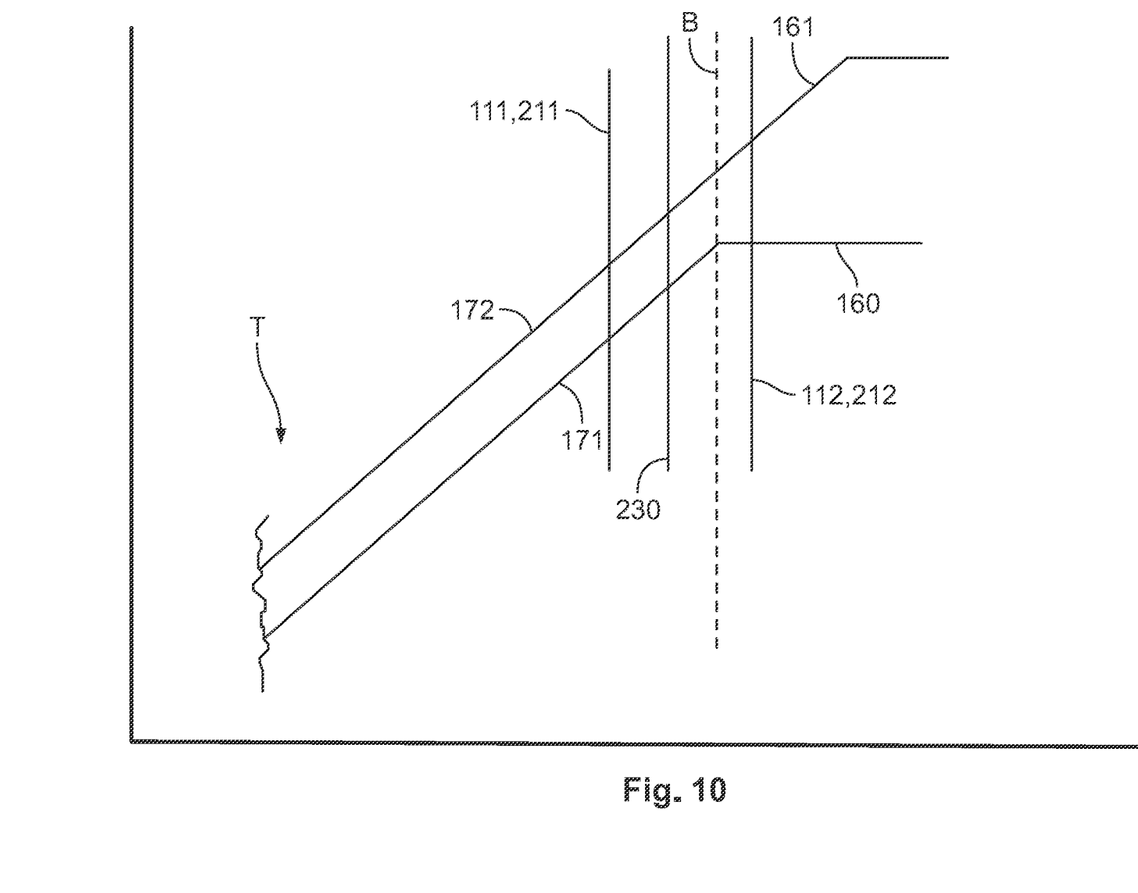
FIG. 10 a schematic view of a switching behaviour of a detector element and the movement characteristics of the contact bridge and of the contact bridge carrier.

FIG. 10 shows the movement behaviour of the individual components of the switching assembly 100 corresponding to the above-described function. A movement of a driving element, e.g. the drive rod 28, is plotted to the right. The respective positions of the moving components are plotted towards the top. A movement curve 171 of the contact bridge 20 is essentially linear and proportional up to a point at which the bridging position B is reached. From there on, the position of the contact bridge 20 does not change, as it is blocked by the contact points 21 entering into contact with the contacts 10. In contrast, the movement curve 172 of the contact bridge carrier 25 shows that, after having reached the bridging position B, the contact bridge carrier 25 continues to move linearly and proportionally until it finally reaches an end position.

In order to be sure that the bridging position B has definitely been reached, one of the switching points 112 and its associated position 212 may be located behind the bridging position B. The switching point 112 and its associated position 212 are thus located in a contact area 160 of the contact bridge and in an overtravel area 161 of the contact bridge carrier 25. For example, the switching point 112 may be located approximately centrally in the overtravel area 161, i.e., approximately at half of the spring travel between contact establishment and full compression of the spring 23.

The bridging position B is thus located between the first switching point 111 and the second switching point 112 and between their associated positions 211, 212. In addition, the boundary 230 of the malfunction area is again located between the two switching points 111, 112 and between their associated positions 211, 212. The boundary 230 is located between the bridging position B and the first switching point 111 and its associated position 211, respectively.

From the combination of the output signals 80 of the two detector elements 60, the state of the switching assembly 100 can be determined. For example, if it can be inferred from the output signal 80 of the detector element 60 assigned to the separated position T that the contact bridge 20 has left the separated position T, while from the output signal 80 of the detector element 60 assigned to the bridging position B it can be inferred that the contact bridge 20 has not yet arrived at the bridging position B, a defect may exist.

Further, a combination of the output signals 80 with a control signal may be used for the purpose of analysis. For example, it can be concluded that a malfunction, such as a weld, exists if the control signal is such that the contact bridge 20 should move away from the bridging position B, but no corresponding output signal 80 is present at the detector element 60 assigned to the bridging position B.

Figure 6:
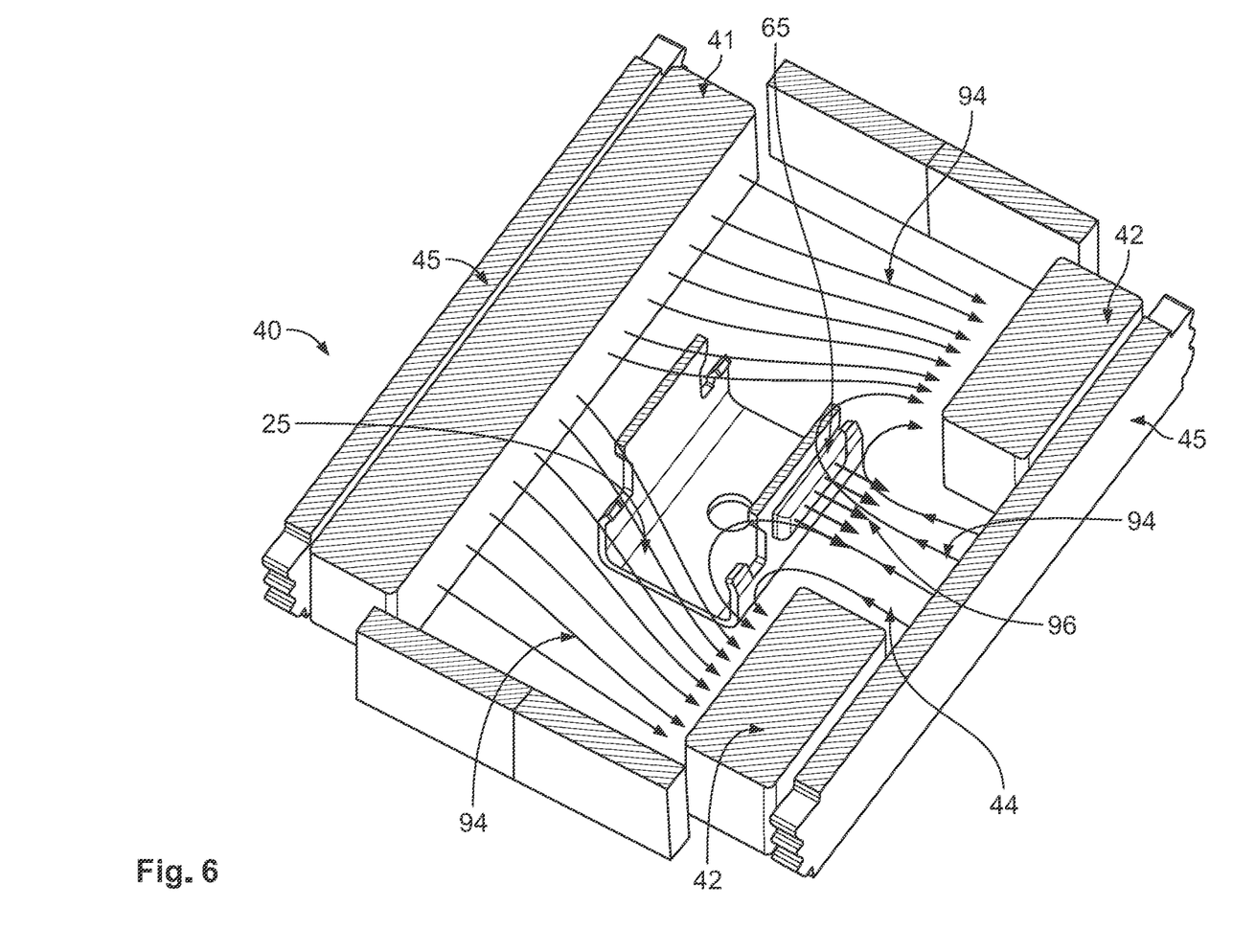
FIG. 6 a schematic, sectional perspective view of a switching assembly.

FIG. 6 illustrates the magnetic measurement principle that may be used in an exemplary embodiment of the switching assembly 100. The switching assembly 100 comprises a blow magnet assembly 40 including a first broad magnet 41 on one side and two sub-magnets 42 on the other side of the switching chamber 15. The blow magnet assembly 40 generates in the switching chamber a magnetic field 94 that deflects and thus extinguishes arcs occurring when the contact bridge 20 is being separated from the contacts 10. Magnetic field conducting elements 45 close the magnetic circuit.

The indicator element 65 generates an additional magnetic field 96. Depending on the position of the indicator element 65, the detector elements 60 will detect either an inwardly directed total magnetic field or an outwardly directed total magnetic field. The total magnetic field is established by the superposition of the two magnetic fields 94, 96. The detector 50 is arranged in a slot 44 between the two sub-magnets 42.

Figure 7:
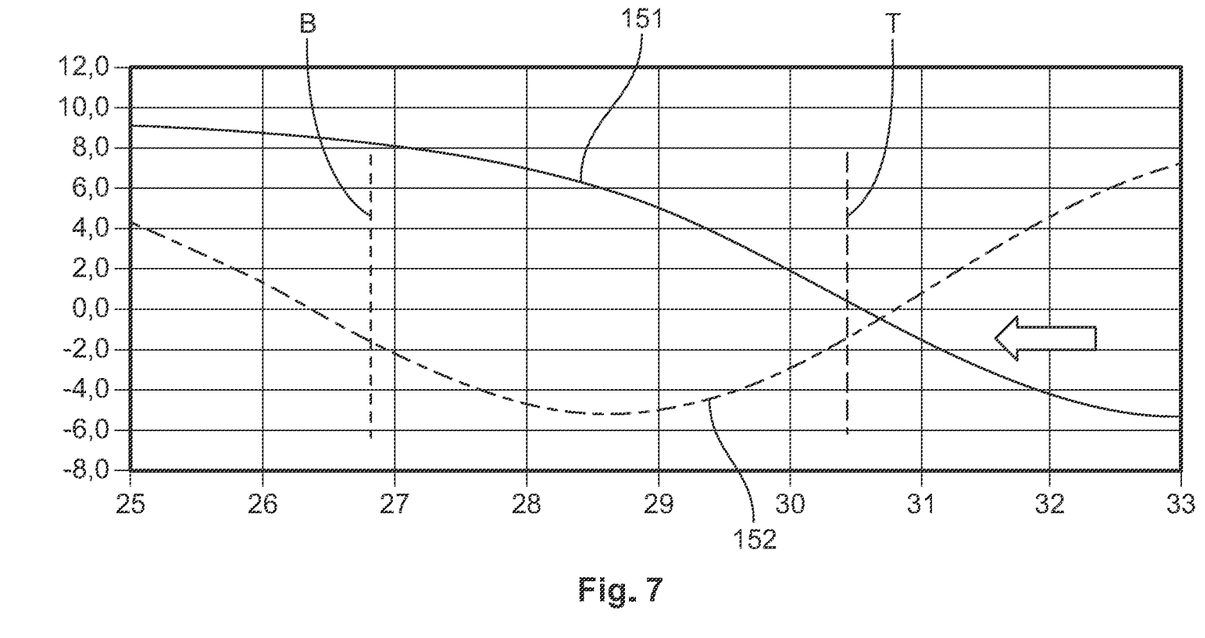
FIG. 7 a schematic view of two magnetic field curves in the switching assembly.

Referring now to FIG. 7, the magnetic fields in the area of the detector 50 are shown. A first curve 151 corresponds to the situation in which the indicator element 65 is arranged before the detector element 60 which is assigned to the separated position T. The second curve 152 corresponds to the situation in which the indicator element 65 is arranged before the detector element 60 which is assigned to the bridging position B. The curves 151, 152 show the respective magnetic field that is measured by a probe guided along the switching direction S. The magnetic field changes from a respective positive direction to a respective negative direction, with the transition being in the vicinity of the bridging position B or the separated position T. If the detected magnetic field is significantly greater than will be necessary to switch the detector element 60, the detection cannot be affected by any possible occurring interference. A strong signal-to-noise ratio can thus be realized.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A switching assembly comprising:
a pair of fixed contacts;
a contact bridge movable between a bridging position in which the contact bridge electrically connects the contacts to one another and a separated position in which the contacts are electrically separated from one another; and
a detector including:
at least one sensor for detecting the presence of the contact bridge in at least one of the separated position or the bridging position; and
a switching controller operatively connected to the sensor, the controller having a first switching point and a second switching point at which the controller switches between a first output signal representing an electrical connection between the contacts and a second output signal representing an electrical separation of the contacts, one of the switching points being associated with a position of the contact bridge between the bridging position and the separated position and creating a hysteresis in the first output signal or the second output signal output by the controller, the one of the switching points is spaced apart from the bridging position and the separated position by a distance greater than the contact bridge can move in the case of a fault.

2. The switching assembly according to claim 1, wherein each of the first and second switching points are associated with positions of the contact bridge between the bridging position and the separated position.

3. The switching assembly according to claim 1, wherein the other switching point is associated with the position of the contact bridge at the bridging position or the separated position.

4. The switching assembly according to claim 1, wherein the separated position or the bridging position is located between positions associated with the first switching point and the second switching point.

5. The switching assembly according to claim 1, wherein the contact bridge is elastically and movably mounted on a contact bridge carrier.

6. The switching assembly according to claim 5, further comprising an indicator element, the position of the indicator element being detectable by the detector.

7. The switching assembly according to claim 6, wherein the indicator element is arranged on the contact bridge carrier.

8. The switching assembly according to claim 6, wherein the indicator element comprises a permanent magnet.

9. The switching assembly according to claim 1, wherein the at least one sensor comprises a first sensor and a second sensor.

10. The switching assembly according to claim 9, wherein the switching controller includes a pair of two-point controllers for each of the first and second sensors.

11. The switching assembly according to claim 1, wherein the at least sensor comprises a Hall sensor.

12. The switching assembly according to claim 1, wherein the at least one sensor is arranged on a printed circuit board.

13. The switching assembly according to claim 1, wherein the at least one sensor is arranged outside a switching chamber in which the fixed contacts and the contact bridge are arranged.

14. The switching assembly according to claim 13, wherein the at least one sensor is arranged in a slot of a blow magnet assembly, the blow magnet assembly generating a magnetic field in the switching chamber for extinguishing arcs occurring when the contact bridge is separated from the fixed contacts.

15. The switching assembly according to claim 14, wherein the blow magnet assembly includes a first magnet arranged on a first side of the switching chamber and two sub-magnets arranged on a second side of the switching chamber.

16. The switching assembly according to claim 1, wherein a difference in signal strengths measured by the detector between the separated position or the bridging position is greater by at least a factor of 5 than a difference in signal strength necessary for the controller to switch between the first switching point and the second switching point.

17. A method of measuring a position of a contact bridge of a switching assembly having two contacts, comprising:
switching a controller from a first output signal representing an electrical connection between the contacts to a second output signal representing an electrical separation of the contacts at a first switching point when the contact bridge moves from a bridging position in which the two contacts are electrically connected, to a separated position in which the two contacts are electrically isolated; and
switching the controller from the second output signal to the first output signal at a second switching point, distinct from the first switching point, when the contact bridge moves from the separated position to the bridging position, at least one of the switching points being associated with a position of the contact bridge between the bridging position and the separated position and creating a hysteresis in the first output signal and/or second output signal output by the controller, the one of the switching points is spaced apart from the bridging position and the separated position by a distance greater than the contact bridge can move in the case of a fault.

18. The method of claim 17, wherein each of the first and second switching points are associated with positions of the contact bridge between the bridging position and the separated position.

19. The method of claim 17, wherein the other switching point is associated with the position of the contact bridge at the bridging position or the separated position.

20. The method of claim 17, wherein the separated position or the bridging position is located between positions associated with the first switching point and the second switching point.

* * * * *